United States Patent [19]
Spadea

[11] 3,983,620
[45] Oct. 5, 1976

[54] SELF-ALIGNED CMOS PROCESS FOR BULK SILICON AND INSULATING SUBSTRATE DEVICE

[75] Inventor: Gregorio Spadea, Saratoga, Calif.

[73] Assignee: National Semiconductor Corporation, Santa Clara, Calif.

[22] Filed: May 8, 1975

[21] Appl. No.: 575,655

[52] U.S. Cl. .................................. 29/571; 29/578; 357/42; 357/91
[51] Int. Cl.² .................................. B01J 17/00
[58] Field of Search .................. 29/571, 578, 576 B; 357/42, 91

[56] References Cited
UNITED STATES PATENTS

| | | |
|---|---|---|
| 3,461,361 | 8/1969 | Delivorias .............................. 29/571 |
| 3,750,268 | 8/1973 | Wang .................................... 29/571 |
| 3,912,559 | 10/1975 | Harigaya .............................. 357/42 |
| 3,921,283 | 11/1975 | Shappir ................................ 29/571 |

Primary Examiner—W. Tupman
Attorney, Agent, or Firm—Lowhurst & Aine

[57] ABSTRACT

The method for fabrication of a self-aligned gate CMOS structure which employs no additional masking steps as compared to the standard CMOS fabrication process, this improved process providing the advantages of self-alignment between the N+ and P+ source and drain diffusions with respect to their gate regions, and metal contact openings which do not overlap the edges of the P+ or N+ source and drain regions. The self-aligning gate region is defined by a silicon nitride gate layer. Several embodiments of the novel process are described.

1 Claim, 19 Drawing Figures

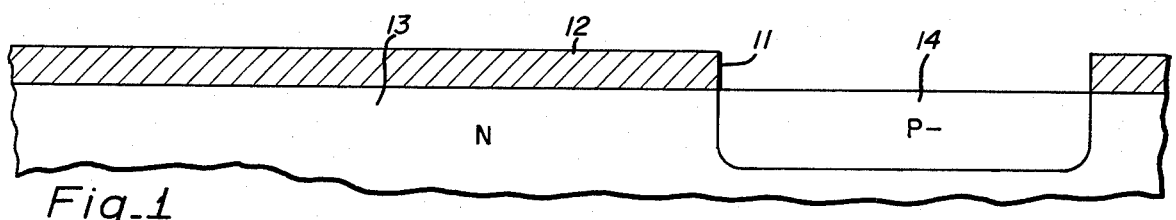
Fig_1
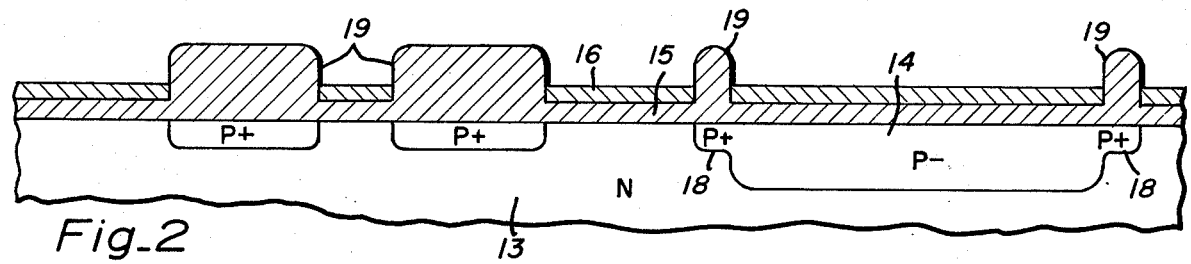
Fig_2
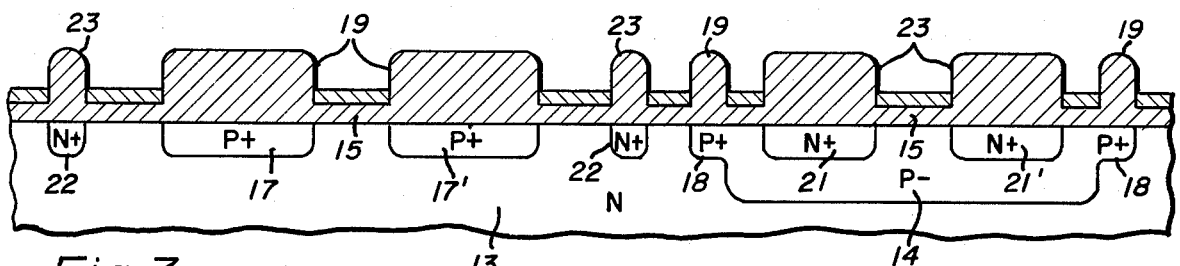
Fig_3
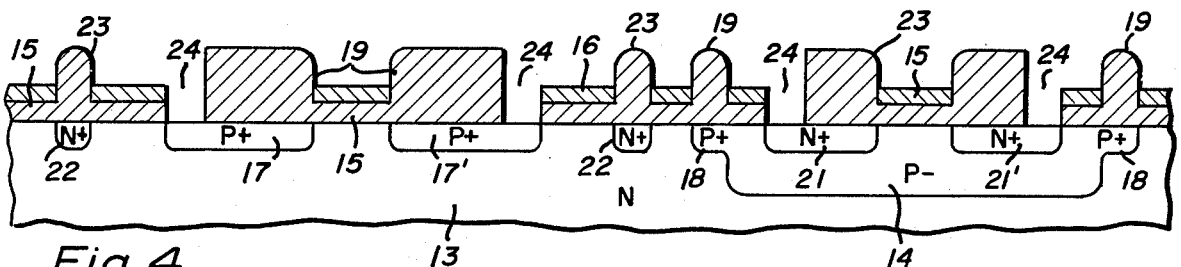
Fig_4
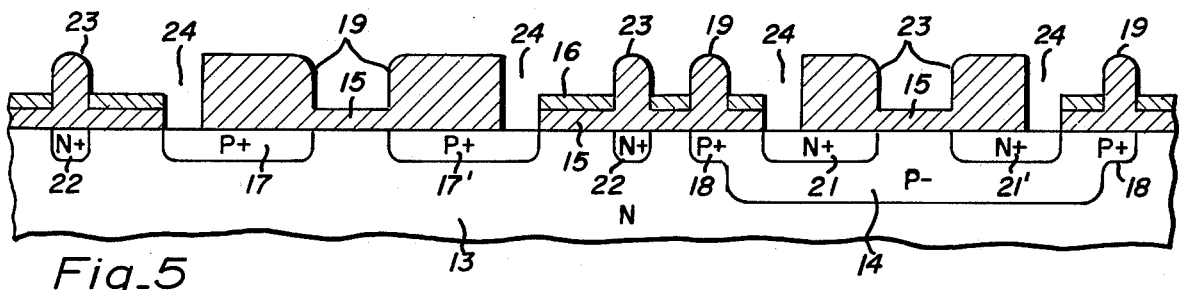
Fig_5
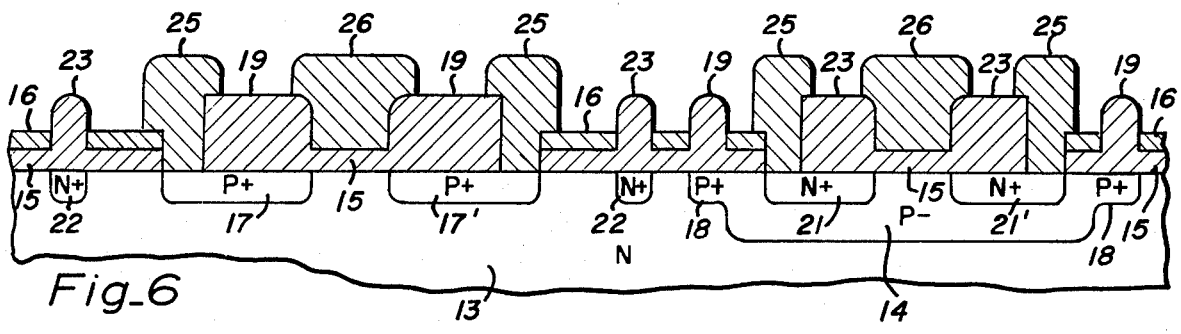
Fig_6

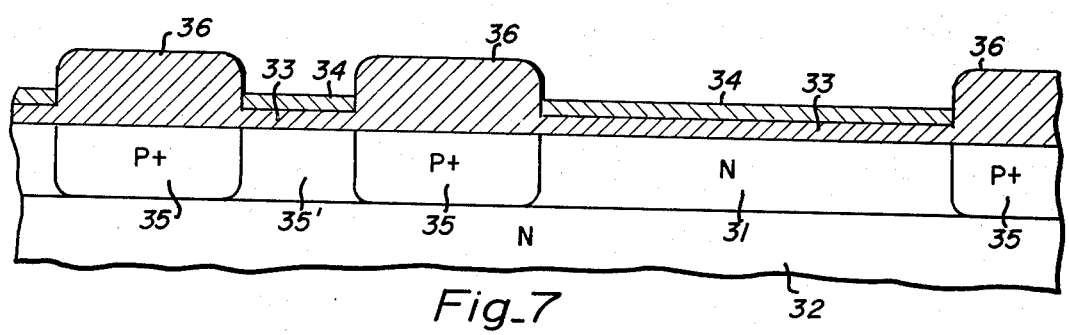
Fig_7
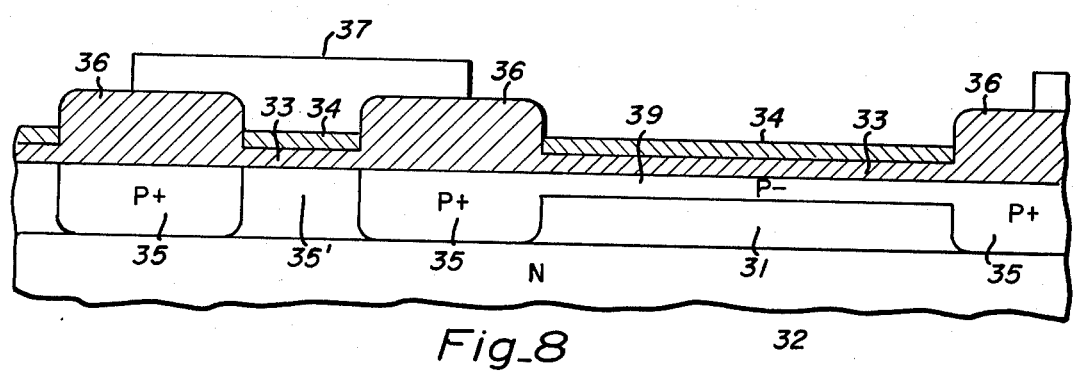
Fig_8
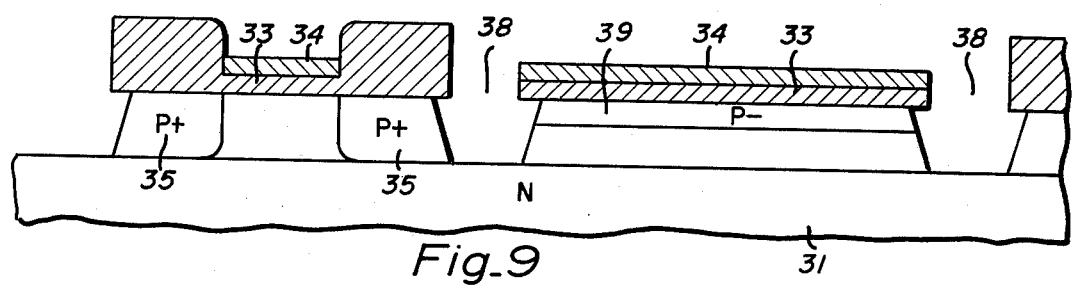
Fig_9
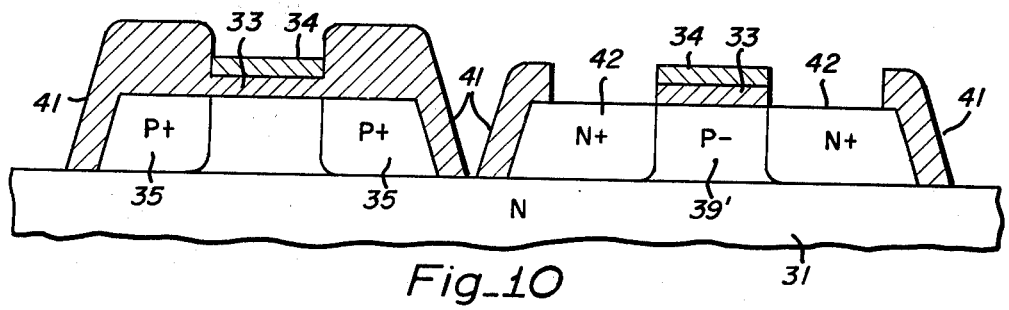
Fig_10
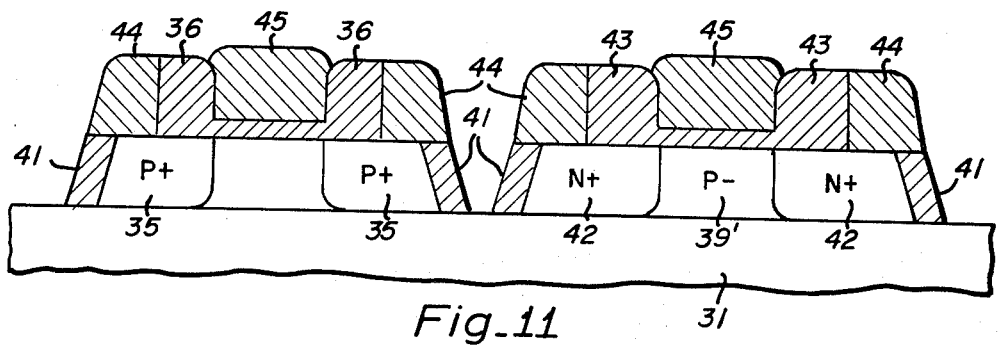
Fig_11

SELF-ALIGNED CMOS PROCESS FOR BULK SILICON AND INSULATING SUBSTRATE DEVICE

BACKGROUND OF THE PRESENT INVENTION

In a conventional complementary metal oxide semiconductor (CMOS) integrated circuit fabrication, and assuming an N type semiconductor substrate, the first stage includes the photoresist masking and etching of the silicon oxide layer on the substrate to form openings therein for the P− diffusion into the N substrate. The second masking and etching of the silicon oxide layer is to form openings for the P+ diffusion regions forming the drain and source for the P channel gate devices. The third masking and etching step in the silicon oxide layer is utilized to form the openings for the source and drain N+ diffusions for the N channel gate devices in the P− diffused regions. A fourth masking and etching step is used to form the openings through the silicon oxide at the gate regions of the P channel and the N channel devices, the thin gate oxide film thereafter being thermally grown. The fifth masking and etching step is provided to form the contact openings through the silicon oxide layer to the various P+ and N+ source, drain and substrate regions. The sixth masking step is used to form the metal interconnections between the various contact openings and to define the metal gate electrodes over the thin gate oxide film in the channel regions of the gate devices. In this conventional CMOS fabrication, the gate regions for the various gate devices are defined after the P+ and N+ diffusion, i.e., with the fourth masking step. It is necessary to make oversized gate openings to be sure that the gate regions overlap the P+ source and drain regions and the N+ source and drain regions, taking into consideration the normal amount of mask misalignment in the P+ and N+ masking steps. A tolerance figure of 0.1 mil is typical and the gate areas must be large enough to take into consideration this normal tolerance, and thus an overlap of the gate region with the source and drain regions is produced. This overlapping of the gate and the drain and source regions introduces a large parasitic capacitance between the metal gate electrode and the P+ and N+ regions separated by the thin gate oxide layer. This parasitic capacitance reduces the speed of the integrated circuit in operation. It is therefore desirable that a fabrication technique be employed which produces no overlap between the gate and the source and drain regions so that the metal gate electrode over the source and drain regions is separated therefrom by a thick oxide insulation layer rather than the thin gate oxide layer, thus eliminating parasitic capacitance.

A second undesirable feature of the conventional CMOS fabrication results from the misalignment between the N+, P+ and contact opening mask and can severely limit the yield of a large size CMOS circuit. This misalignment dictates that the contact openings must be designed well inside the P+ and N+ diffusion areas in order to compensate the misalignment and mask dimension variation. In order to provide for this variation in contact location, it is necessary that the area of the CMOS structure be greater than desired.

A third undesirable feature of the conventional CMOS process is that the gate oxidation is performed after the N+ and P+ diffusion steps and, since this gate oxidation is performed at a relatively high temperature, the P+ and N+ junction depths cannot be kept as shallow as desired and the resulting surface concentration of impurities is lower than in the case of a process where the gate oxidation is done before the source and drain diffusions.

One known technique for overcoming certain of the above undesirable characteristics of the conventional CMOS technique employs a silicon nitride ($Si_3N_4$) mask to define the openings for the P+ and N+ source and drain diffusions, the silicon nitride mask also defining the gate area. After the source and drain diffusion steps, the silicon nitride layer is removed from all areas except the gate regions and a thick silicon oxide layer is grown on all such areas, leaving the silicon nitride over the self-aligned gate areas. After the thick oxide has been grown, the silicon nitride defining the gate regions is selectively etched away and replaced by a thin silicon oxide gate layer. Thereafter the contact openings are made in the thick oxide in the source and drain regions and a metallization step forms the source and drain contacts and the metal gate electrodes. In this self-aligning gate technique there is no overlap of the thin gate oxide and the source and drain regions so that there is no parasitic capacitance of the type described above. However, due to the misalignment of the P+ and N+ diffusion masks, the contact openings through the thick oxide layer and into the P+ and N+ source and drain regions must be designed well within the boundaries of the source and drain regions and the resulting area size for the large scale CMOS structure is undesirably great.

SUMMARY OF THE PRESENT INVENTION

The present invention provides a novel method and apparatus whereby a self-aligned gate CMOS structure is provided which employs no additional masking steps as compared to the standard CMOS process but which provides the advantages of self-alignment between the N+ and P+ diffusions with respect to the gate area, contact openings which do not overlap the edge of the P+ or N+ diffused areas independently of the amount of misalignment between the P+, N+ and contact opening masking levels, and a shallower junction depth than in the case of the conventional CMOS process.

In one preferred embodiment of this novel fabrication technique, a first mask is employed to define the P− region in the N substrate of the semiconductor device. Thereafter a thin gate oxide layer followed by a thin silicon nitride layer are formed over the entire substrate surface. The second masking step is employed to define the P+ regions where the silicon nitride is first etched and the silicon oxide layer thereafter etched to open up the P+ deposition regions for the standard P+ deposition and resultant thick oxide layer growth over the P+ areas. During the third masking step the N+ deposition regions are opened by etching the silicon nitride and the silicon oxide at the N+ regions followed by the N+ diffusion and resultant thick oxide layer growth over the N+ diffused areas. The fourth masking step is utilized to define the openings in the thick silicon oxide insulation layer for contact openings to the P+ and N+ source and drain diffusion regions. The silicon nitride layer at the boundaries of all the P+ and N+ source and drain regions insures that the contact openings in the thick oxide layers over the P+ and N+ regions do not extend outside the source and drain regions regardless of any misalignment between the N+, P+ and contact opening masks. A fifth masking step is then employed to mask all areas on the substrate except the gate regions. The very thin silicon oxide film formed at the gate region is first etched away followed by a selective etch, for example a phosphoric etch, to remove the silicon nitride layer over the gate region, leaving the thin gate oxide layer in the gate region. After metallization, a sixth masking step is employed to define the metal connect and interconnect contacts for the device. As with the conventional CMOS technique, six masking steps are employed. However, due to the self-aligning nature of the formation of the gate region, there is no overlapping of the thin gate oxide with the source and drain diffusion regions and thus no parasitic capacitance formed at the gate regions. Also, the contact openings to the source and drain regions are limited to the edges of such regions by the presence of the silicon nitride mask level at the boundaries of these regions.

In a further embodiment of the present invention used to form P channel and N channel gate devices on insulating substrates, a self-aligning gate technique is utilized and only five masking steps are employed. In this novel technique a silicon gate layer and an overlying silicon nitride layer are formed over the N type silicon layer grown on the insulating substrate. The first masking step is utilized to define the P+ source and drain regions which are then made in the N type grown silicon layer. After P+ diffusion, the second masking step is utilized to define those areas where the grown silicon is etched to isolate the P channel regions in the grown silicon layer from the N channel regions. After development of the photoresist, boron atoms are implanted in the N channel transistor area, the photoresist acting as a mask against the ion implantation. The oxide not protected by the photoresist is etched away and a silicon etch performed to isolate the various transistors. The silicon nitride still present over the N channel transistor masks this region against the silicon etch. Thereafter a third masking step is used to define the N+ diffusion regions in the grown silicon layer. After removal of the nitride layer still left over the gate regions, a fourth masking step then defines the contact openings to the P+ drain and source regions and the N+ drain and source regions. A fifth masking step is then employed to define the metallization areas for forming contact to the source and drain regions and for forming the gate electrodes over the gate regions. Since only five masking steps are employed in this novel technique for fabricating P channel and N channel devices in insulating substrates, one masking step is saved over the conventional CMOS fabrication technique described above. In addition, the conventional CMOS fabrication method for fabricating P and N channel devices on insulating substrates employs a seventh masking step, i.e., a silicon etch mask, and therefore the present technique saves two masking steps over the known conventional CMOS technique employed on insulating substrates.

When the first process described above is employed, at the end of the process all the undiffused regions are protected with a layer of silicon nitride over thin gate oxide except at the gate regions of the devices. Sometimes this is an undesirable configuration, because of the low field inversion voltage of the layer of silicon nitride over gate oxide.

This problem can be eliminated by modifying the process flow wherein the first operation is the growth of a thin gate oxide layer followed by a silicon nitride deposition layer. With the first mask the silicon nitride and oxide are removed in all the regions where no diffusions are wanted at the end of the process, and are therefore left where source, drain, gate regions and guard rings are wanted.

During the second masking operation, a negative photoresist is deposited and exposed in such a way that, after development, the photoresist is left only outside the regions where an N channel transistor will be formed. By means of the well known ion implantation process, a P dopant is introduced into the silicon at the N channel transistor region to form a shallow layer; the photoresist masks the other areas. The implanted boron atoms are then driven in to form the P− region and, at the end of this diffusion step, a thick thermal oxide is grown selectively in the regions not protected by the silicon nitride layer.

The third masking and etching step removes the silicon nitride and gate oxide from the P channel source, drain regions and P+ guard regions and the P+ diffusion is performed. The fourth masking step opens the N channel source and drain and guard region after which the N+ diffusion is performed. The silicon nitride is then removed at the gate regions with a selective etch of phosphoric acid. The fifth masking operation is used to form contact openings to the source and drain regions and, after metallization, the sixth mask defines the metal interconnect pattern.

When this process is used, the self-aligning nature of the formation of the gate regions is retained and also the contact openings to the source and drain regions are limited to the edges of such regions because the initial oxide grown outside the diffused regions can be made easily at least two times thicker than the oxide grown during N+ and P+ diffusions.

It is also well known that if a CMOS circuit is operated with a low supply voltage, the P+ and N+ guard rings can be used in direct contact with the source-drain diffusion edges and no undiffused spacing has to be left between the guard rings themselves. The present invention can be applied to fabricate such circuits with the significant advantage that only five masking steps are now needed while the self-aligned nature of the gate formation is retained.

After the formation of the gate oxidation layer and nitride deposition layer, the N+ source and drain regions are defined with the first masking operation together with the N+ guard ring region around the P channel transistor and the silicon nitride etched at these regions.

During the second masking operations, photoresist is used to mask the thin layer of implanted boron atoms outside the N channel transistor area and the step of ion implantation is carried out followed by resist removal. After drive in of the shallow implanted boron layer to form a P region, the thin gate oxide is removed wherever it is exposed and the N diffusion performed.

The third mask is then used to remove the nitride and gate oxide from the P+ source and drain regions and guard ring. After P+ diffusion, the nitride left on the gate areas is then selectively removed. Contact holes to the source and drain regions are opened with the fourth masking operation. Metallization takes place and then the fifth mask is then used to define the metal pattern.

Again, since the oxide grown after N+ diffusion can be made much thicker than the gate oxide, the third mask openings can overlap the already diffused N+ regions, but still the P+ diffusion will be exactly coincident with the N+ diffusion.

BRIEF DESCRIPTION OF THE DRAWINGS

FIGS. 1 through 6 inclusive are cross-sectional views illustrating six successive stages in the fabrication of a self-alignment gate type CMOS device of the present invention.

FIGS. 7 through 11 inclusive are cross-sectional views illustrating certain successive stages in the fabrication of another form of self-alignment CMOS device on an insulating substrate utilizing the present invention and employing five masking steps.

DESCRIPTION OF THE PREFERRED EMBODIMENT

Figure 12:
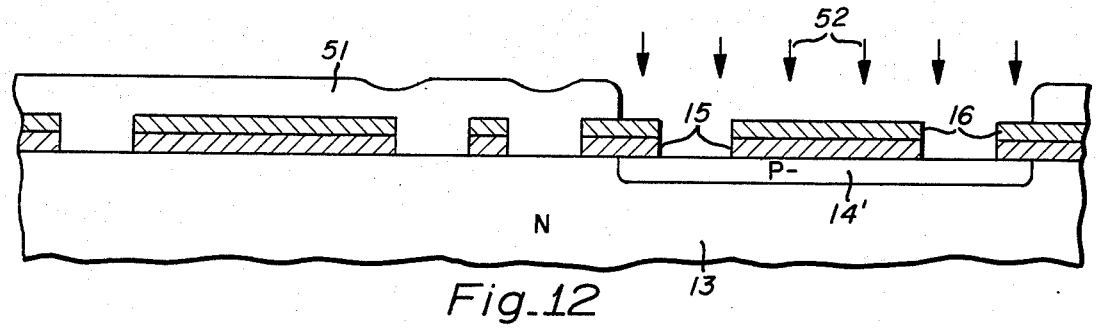
FIGS. 12 through 15 inclusive are cross-sectional views illustrating the successive stages in the fabrication of a form of self-alignment gate type CMOS which is a modification of the device of FIGS. 1 through 6.

Referring now to FIGS. 1 through 6, a semiconductor device made in accordance with the present invention is shown in a preliminary fabrication stage in FIG. 1 wherein the first masking and oxide etching stage has been employed to form the desired openings 11 in the silicon oxide layer 12 formed on the N substrate 13 of the body, the P− regions 14 being diffused into the N substrate 13 through said openings in well known manner. After the diffusion of the various P− regions 14, the silicon oxide layer 12 is stripped from the surface and thereafter a thin silicon oxide gate layer 15, for example 1,000 angstroms, is formed over the entire surface. This layer is then followed by the growth by standard techniques of a thin silicon nitride ($Si_3N_4$) mask layer 16 on the oxide layer 15, this silicon nitride layer 16 being about 1000–2000 A thick.

A second mask is then used to define the P+ diffusion regions, i.e., the P+ source and drain regions 17, 17' for the P channel devices and the P+ guard rings 18 for the N channel regions to be subsequently formed in the P− regions 14. Openings in the silicon nitride layer 16 and the silicon oxide layer 15 are then formed by conventional etching to expose these P+ regions. A P+ diffusion then takes place to form the P+ regions 17, 17', 18 during which diffusion the thick silicon oxide layer 19 is formed over these P+ regions (see FIG. 2).

Thereafter a third masking step, subsequent silicon nitride etch and silicon oxide etch, and N+ diffusion are utilized to form the N+ diffusion regions 21, 21', 22 in the N substrate 13. During the diffusion a thick thermal oxide 23 forms over these regions. This stage of fabrication is shown in FIG. 3. The N+ regions 21, 21' form the N channel devices in the P− regions 14 and the N+ regions 22 form isolation rings around the various P channel regions. It should be understood that the P+ and N+ guard rings 18 and 22 are not necessary in all cases in the formation of P channel and N channel devices utilizing the present invention.

A fourth masking step is then employed to define the contact openings 24 through the thick silicon oxide layers 19 and 22 to the P+ and N+ source and drain regions 17, 17' and 21, 21' and a silicon oxide etch follows to remove the oxide at openings 24 (see FIG. 4).

A fifth masking step is then provided to protect all areas on the surface except the gate regions of the P channel 17, 17' and N channel 21, 21' devices. A silicon oxide etch is then used to remove any oxide film that may be on the $Si_3N_4$ layers at the gate region of the channels. This is followed by etching away the $Si_3N_4$ layer 16 at the gate regions of the P+ channel the N+ channel devices (see FIG. 5).

A sixth mask is then formed over the surface of the device to define the metal contact 25 for the various source and drain regions and the gate electrodes 26 for the channel regions (see FIG. 6).

Due to the utilization of the silicon nitride mask layer 16 in the gate regions during the diffusion of the source and drain regions 17, 17', 21, 21' in both the N channel devices and the P channel devices, the gate regions are self-aligned with regard to the edges of the diffused source and drain regions 17, 17', 21, 21'. Thus no parasitic capacitance is formed in these regions due to the fact that the metal of the gate electrode 26 is separated from the source and drain diffusion regions 17, 17', 21, 21' by a thick oxide layer as opposed to an overlapping thin oxide gate layer as in the conventional CMOS devices.

Also the silicon nitride layer 16 at the outer edges of the P+ diffusion regions 17, 17' and the N+ diffusion regions 21, 21' acts as one boundary of the mask for the contact openings 24 to be made in the thick oxide metal films 19 and 23. Thus, although the contact opening mask extend beyond the edges of the regions 17, 17' and 21, 21' due to misalignment or the like, the silicon nitride layer 16 acts as an effective etch defining mask for the contact opening. As a result, large size CMOS structures can be limited in their overall area.

This novel fabrication technique uses a processing which is compatible with standard metal gate CMOS technology. It utilizes the same number of masking steps, but the process steps for the P+ and N+ diffusions are less critical, and higher density devices are produced.

It should be noted that the particular conductivity for the substrate 13 and regions 21, 21' is chosen as N type and the conductivity for the regions 14 and 17, 17' is chosen as P type. Devices with the opposite conductivity for these regions may be fabricated by the novel process described above.

Referring now to FIGS. 7 through 11 a novel technique is disclosed wherein the self-aligning gate technique of the present invention is employed for the formation of P channel and N channel gate devices on an insulating substrate, this novel technique employing only five masking steps in the fabrication process. In accordance with standard insulating substrate techniques, a one-half to 1 micron thick N layer 31 in the form of single crystal silicon is grown on the insulating substrate 32 which may be, for example, sapphire or spinel. A thin silicon oxide gate layer 33, for example 1000 A thick, is grown on the surface of the N silicon and a thin, for example 1000–2000 A thick, silicon nitride layer 34 is grown over the oxide layer.

A first masking step followed by a silicon nitride etch and a silicon oxide etch is used to open the surface layers to the P+ diffusion regions and the P+ regions 35 are formed therein by diffusion. During the diffusion step, a thick silicon oxide layer 36 forms over these regions. The gate regions between the source and drain P+ diffusion regions 35 are then protected by a photoresist mask 37, this mask 37 and the silicon nitride layer 34 over the remainder of the surface of the device protecting the silicon oxide at all regions except where openings 38 are desired in the silicon oxide and in the underlying N silicon layer forming isolation regions between the P channel devices and the N channel devices. Thereafter a well known P− ion implantation step is utilized to form a P− channel region 39 between the source and drain region areas of the to be formed N channel devices. An oxide etch followed by a silicon etch is then utilized to remove the portion of the silicon oxide layer 36 and the silicon layer 31 in regions 38. The photoresist 37 protects the P channel devices on the substrate 32 during etching while the silicon nitride layer 34 protects the N channel regions on the substrate 32.

A thermal oxide is then grown over the substrate to cover the edges 41 of the P channel regions and the N channel regions. A third mask is then formed to define the N+ diffusion regions 42 and the silicon nitride layer and underlying silicon oxide layer are etched away from these regions, the N+ diffusion then taking place to form the N+ source and drain regions 42 in the N channel devices (FIG. 10). During this N+ diffusion a thick thermal oxide layer 43 is grown over the N+ regions.

A fourth mask is then formed over the device to define the openings in the thick oxide layers 36 and 43 leading to the various P+ and N+ source and drain regions and an oxide etch produces these openings. Then a silicon nitride etch, such as a hot phosphoric etchant, is used to etch away the silicon nitride layer 34 remaining at the gate regions. The fifth masking step is then employed to define the metallization regions where the metal contacts 44 are formed with the various source and drain regions and the gate electrodes 45 are formed at the gate regions.

It is noted that in this embodiment the silicon nitride layer 34 acts as a mask for the self-aligning gate in the P and N channel devices. In addition, a portion of the silicon nitride layer also serves to define the isolation region 38 made in the grown silicon layer 31 between the N channel devices and the P channel devices. This novel process uses standard CMOS fabrication techniques while providing self-aligned gate devices with a five mask process. The standard non-self-aligned CMOS technique used to form devices on insulated substrates heretofore utilized seven masking steps in the processing; thus the present invention contributes a saving in the number of masking steps required.

When the process described in FIGS. 1–6 above is employed, at the end of the process all the undiffused regions are protected with a layer of silicon nitride 16 over thin gate oxide 15 except at the gate regions of the devices. Sometimes this is an undesirable configuration, because of the low field inversion voltage of the layer of silicon nitride over gate oxide.

This problem can be eliminated by modifying the process flow described above for FIGS. 1–6 in the following manner as shown in FIGS. 12–15. The first operation is the growth of a thin gate oxide layer 15 followed by a silicon nitride deposition layer 16. With the first mask the silicon nitride 16 and oxide 15 are removed in all the regions where no diffusions are wanted at the end of the process, and are therefore left where source, drain, gate regions and guard rings are wanted (see FIG. 12).

Figure 13:
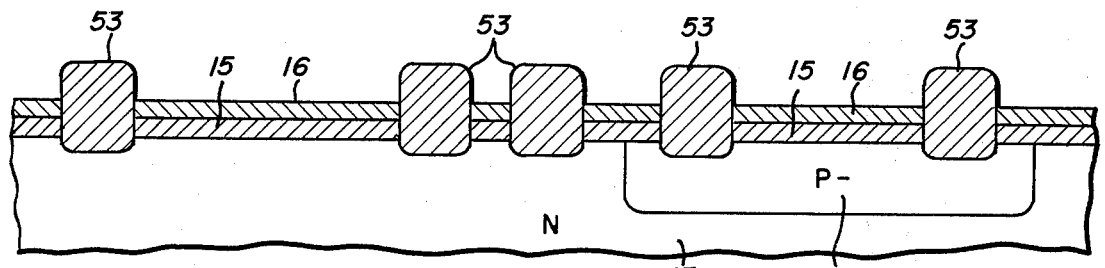

During the second masking operation, a negative photoresist 51 is deposited and exposed in such a way that, after development, the photoresist is left only outside the regions when an N channel transistor will be formed. By means of the well known ion implantation process, a controlled amount of boron atoms 52 are introduced into the silicon at the N channel transistor region to form a shallow layer 14' (FIG. 12); the photoresist 51 where present prevents the boron atoms from reaching the silicon substrate 13. The implanted boron atoms are then driven in to form the P− region 14 and at the end of this diffusion step a thick thermal oxide 53 is grown selectively in the regions not protected by the silicon nitride layer 16 (FIG. 13).

Figure 14:
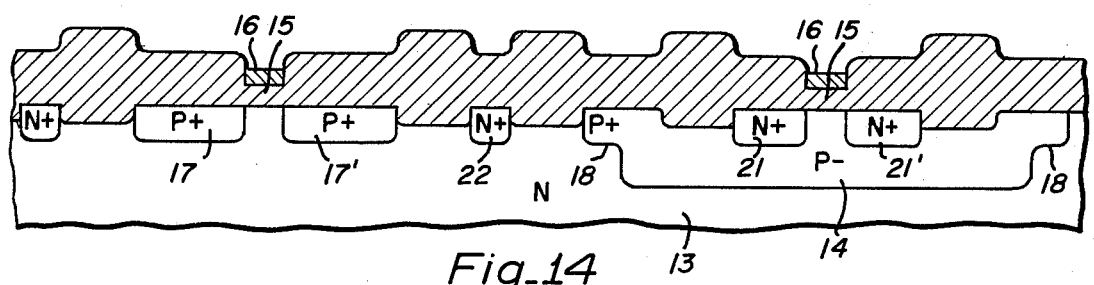
Figure 15:
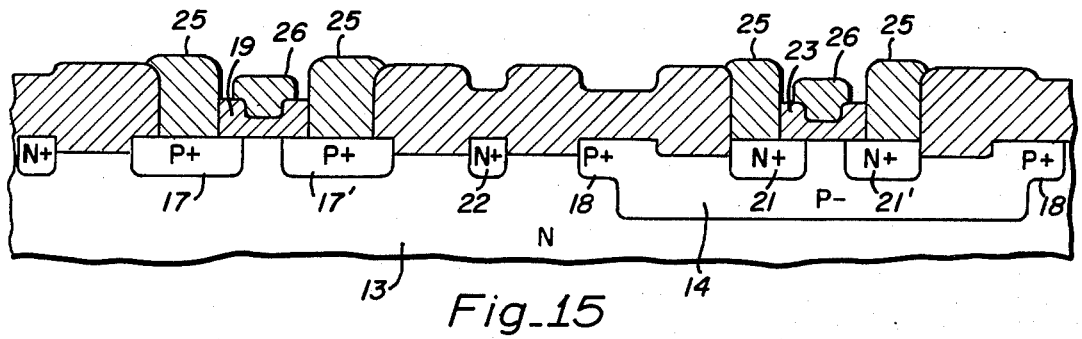

The third masking and etching step removes the silicon nitride 16 and gate oxide 15 from the P channel source and drain regions 17, 17' and guard region 18 and the P+ diffusion is performed. The fourth masking step opens the N channel source and drain regions 21, 21' and guard region 22 after which the N+ diffusion is performed (FIG. 14). The silicon nitride 16 is then removed at the gate regions with a selective etch of phosphoric acid. The fifth masking operation is used to form contact openings to the source and drain regions and, after metallization, the sixth mask defines the metal interconnect pattern 25, 26 (FIG. 15).

When this process is used, the self-aligning nature of the formation of the gate regions is retained and also the contact openings to the source and drain regions are limited to the edges of such regions because the initial oxide grown outside the diffused regions can be made easily at least two times thicker than the oxide grown during N+ and P+ diffusions.

It is well known that if a CMOS circuit is operated with a low supply voltage (e.g., below 5 volts), the P+ and N+ guard rings can be used in direct contact to the source-drain diffusion edges and no undiffused spacing has to be left between the guard rings themselves.

The present invention can be applied to fabricate such circuits as shown in FIGS. 16–19 inclusive with the significant advantage that only five masking steps are now needed and the self-aligned nature of the gate formation is retained.

Figure 16:
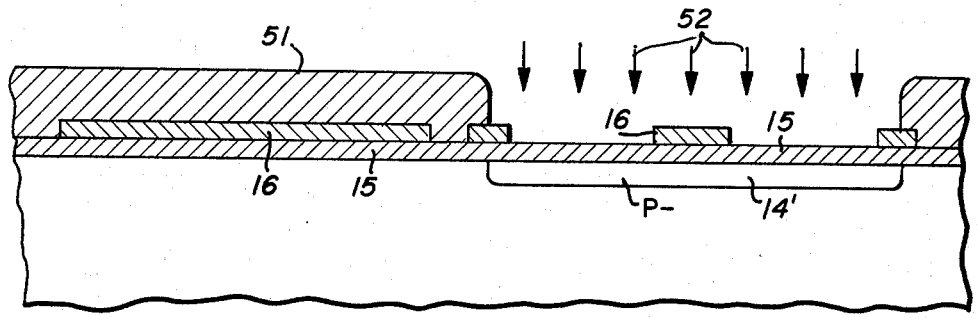
FIGS. 16 through 19 inclusive are cross-sectional views illustrating the fabrication steps of a further form of self-alignment CMOS device incorporating the present invention.

As shown in FIG. 16, after formation of gate oxidation layer 15 and nitride deposition layer 16, the N+ source and drain regions 21, 21' are defined with the first masking operation together with the N+ guard ring region 22 around the P channel transistor and the silicon nitride etched at these regions.

Figure 17:
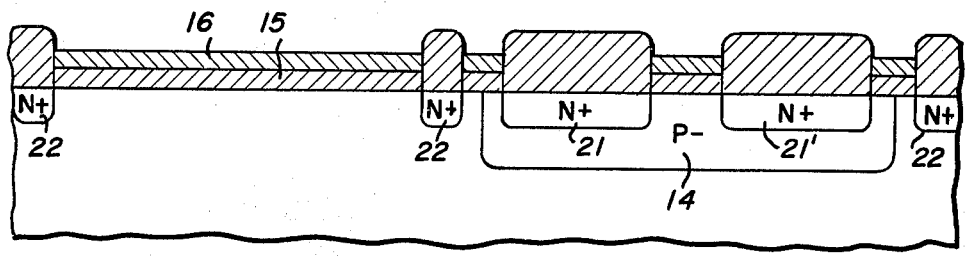
Figure 18:
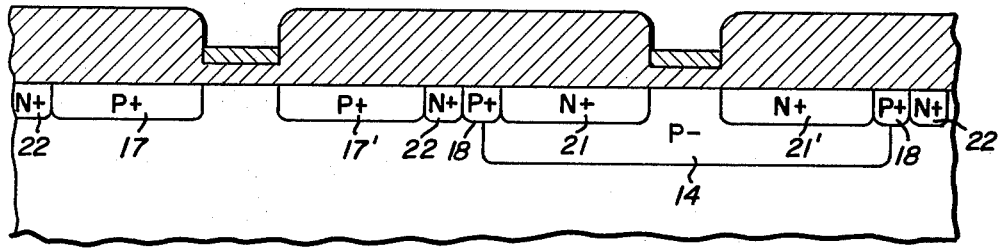

During the second masking operation photoresist 51 is used to mask the thin layer 14' of implanted boron atoms 52 outside the N channel transistor area and the step of ion implantation is carried out of allowed by resist removal. After drive in of the shallow implanted boron layer to form region 14, the thin gate oxide 15 is removed wherever it is exposed and the N+ diffusion 21, 21' and 22 performed (FIG. 17).

Figure 19:
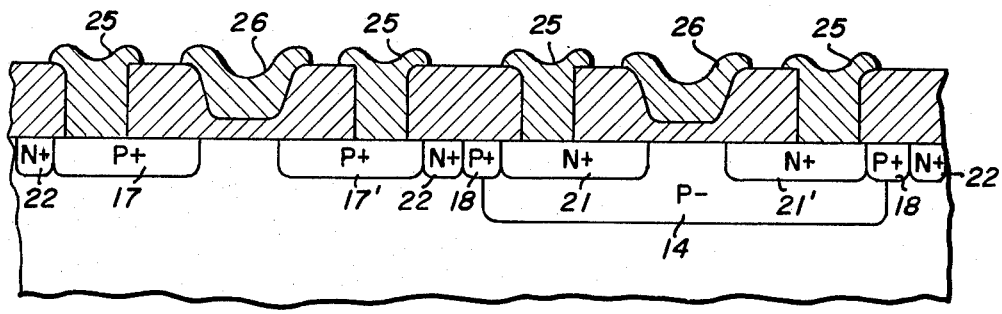

The third mask is then used to remove the nitride and gate oxide from the P+ region 17, 17' and 18. After P+ diffusion (FIG. 18), the nitride 16 left on the gate areas is then selectively removed. Contact holes to the source-drain regions are opened with the fourth masking operation. Metallization takes place and then the fifth mask is then used to define the metal pattern (FIG. 19).

Again, since the oxide grown after N+ diffusion can be made much thicker than the gate oxide, the third mask openings can overlap the already diffused N+ regions, but still the P+ diffusion will be exactly coincident with the N+ diffusion.

For the three processes described in FIGS. 1–6, 12–15 and 16–19, a process variation can be introduced with considerable advantage for the alignment of the contact mask to the diffused regions and the metal mask to the gate regions. Instead of defining the P+ and N+ source-drain regions with two separate masking steps, both regions may be defined with one masking operation in accordance with the well known method of diffusion from a doped oxide. After a layer of oxide heavily doped with phosphorus is deposited on the wafer surface with a subsequent mask, the doped oxide is removed from the P+ regions. A P+ predeposition is then performed, the doped oxide removed, and thermal oxide grown over the diffused regions.

I claim:

1. The method for manufacture of a silicon semiconductor device comprising the steps of:
   forming a first oxide layer over the surface of a semiconductor substrate of a first conductivity type,
   forming a silicon nitride layer over said first oxide layer,
   masking said silicon nitride layer and thereafter etching openings through said silicon nitride layer at those regions where drain and source regions are to be subsequently formed in channel transistors of said first conductivity type,
   masking all those regions where channel transistors of said first conductivity type are not to be formed and leaving exposed those regions where such channel transistors are to be formed in said substrate,
   ion implanting a thin layer of a second conductivity type in said first conductivity type channel transistor regions in said substrate,
   driving said ion implanted layer into said substrate,
   etching said first oxide layer to form openings at the first conductivity type channel transistor source and drain regions,
   diffusing a dopant through said latter openings to form source and drain regions of said first conductivity type in said substrate,
   masking and etching said silicon nitride layer and said first oxide layer to form openings at the second conductivity type channel transistor source and drain regions,
   diffusing a dopant through said latter openings to form source and drain regions of said second conductivity type in said substrate,
   etching the silicon nitride layer at the gate regions,
   masking and etching the oxide formed on the surface during deposition to form contact openings to said source and drain regions,
   depositing a metallization layer over the device,
   masking to define the metal connect and interconnect openings in said metal layer,
   and etching the metal to form the gate electrodes and source and drain connects.

* * * * *